(12) United States Patent
Fukui et al.

(10) Patent No.: US 12,188,147 B2
(45) Date of Patent: Jan. 7, 2025

(54) SINGLE CRYSTAL, DIE FOR EFG APPARATUS, EFG APPARATUS, METHOD FOR MANUFACTURING SINGLE CRYSTAL, AND METHOD FOR MANUFACTURING SINGLE CRYSTAL MEMBER

(71) Applicant: KYOCERA Corporation, Kyoto (JP)

(72) Inventors: Akeo Fukui, Higashiomi (JP); Masatoshi Harada, Okaya (JP)

(73) Assignee: KYOCERA CORPORATION, Kyoto (JP)

( * ) Notice: Subject to any disclaimer, the term of this patent is extended or adjusted under 35 U.S.C. 154(b) by 1249 days.

(21) Appl. No.: 16/769,745

(22) PCT Filed: Dec. 6, 2018

(86) PCT No.: PCT/JP2018/044971
§ 371 (c)(1),
(2) Date: Oct. 13, 2020

(87) PCT Pub. No.: WO2019/112016
PCT Pub. Date: Jun. 13, 2019

(65) Prior Publication Data
US 2021/0017667 A1    Jan. 21, 2021

(30) Foreign Application Priority Data

Dec. 7, 2017   (JP) ................... 2017-235044

(51) Int. Cl.
| | | |
|---|---|---|
| C30B 15/34 | (2006.01) | |
| C01F 7/02 | (2022.01) | |
| C30B 29/20 | (2006.01) | |

(52) U.S. Cl.
CPC ............... *C30B 15/34* (2013.01); *C01F 7/02* (2013.01); *C30B 29/20* (2013.01)

(58) Field of Classification Search
None
See application file for complete search history.

(56) References Cited

U.S. PATENT DOCUMENTS

| | | | |
|---|---|---|---|
| 6,325,852 B1 * | 12/2001 | Theodore | ............... C30B 15/00 117/211 |
| 2008/0075941 A1 | 3/2008 | Tatartchenko et al. | |
| 2009/0136731 A1 | 5/2009 | Tatartchenko et al. | |

(Continued)

FOREIGN PATENT DOCUMENTS

| | | |
|---|---|---|
| JP | S52-65782 A | 5/1977 |
| JP | 2010-504274 A | 2/2010 |

(Continued)

*Primary Examiner* — Chinessa T. Golden
(74) *Attorney, Agent, or Firm* — Procopio, Cory, Hargreaves & Savitch LLP (57) ABSTRACT

A single crystal of the present disclosure is a plate-shaped body having two main surfaces that are opposite to each other, and has bubbles arranged in a plurality of line shapes parallel to the main surface in a region within a depth of 0.5 mm from either one of the main surfaces. Additionally, a single crystal of the present disclosure is a plate-shaped body having two main surfaces that are opposite to each other, and has bubbles arranged in a plurality of line shapes parallel to the main surface within a region from either one of the main surfaces to ¼ of the thickness which is a distance between the main surfaces.

19 Claims, 4 Drawing Sheets

(56) References Cited

U.S. PATENT DOCUMENTS

| | | | |
|---|---|---|---|
| 2014/0116323 A1 | 5/2014 | Tatartchenko et al. | |
| 2014/0239452 A1* | 8/2014 | Sasaki | C30B 29/22 423/624 |
| 2017/0226659 A1 | 8/2017 | Tatartchenko et al. | |

FOREIGN PATENT DOCUMENTS

| | | | |
|---|---|---|---|
| JP | 2014-162698 A | 9/2014 | |
| JP | 2015-131745 A | 7/2015 | |
| JP | 2017-105710 A | 6/2017 | |
| WO | WO-2008036888 A1 * | 3/2008 | C30B 15/14 |
| WO | 2019/112016 A1 | 6/2019 | |

* cited by examiner

SINGLE CRYSTAL, DIE FOR EFG APPARATUS, EFG APPARATUS, METHOD FOR MANUFACTURING SINGLE CRYSTAL, AND METHOD FOR MANUFACTURING SINGLE CRYSTAL MEMBER

TECHNICAL FIELD

The present disclosure relates to a plate-shaped single crystal, a die for an EFG apparatus for manufacturing the plate-shaped single crystal, an EFG apparatus having the die for the EFG apparatus, a method of manufacturing the single crystal by using the EFG apparatus, and a method for manufacturing a single crystal member obtained by processing the single crystal.

BACKGROUND ART

In the growth of a sapphire crystal from alumina melt by a method such as an EFG method, it is required to reduce impurities which mix into the melt from a raw material, a crucible and other materials, and then mix into the crystal (Patent Documents 1 and 2).

PRIOR ART DOCUMENTS

Patent Documents

[Patent Document 1] Japanese Patent Unexamined Publication No. 2015-131745

[Patent Document 2] Japanese Patent Unexamined Publication No. 2014-162698

SUMMARY OF THE INVENTION

A single crystal of the present disclosure is a plate-shaped body having two main surfaces opposite to each other, and has bubbles arranged in a plurality of line shapes parallel to the main surface in a region within a depth of 0.5 mm from either one of the main surfaces.

A single crystal of the present disclosure is a plate-shaped body having two main surfaces opposite to each other, and has bubbles arranged in a plurality of line shapes parallel to the main surface within a region from either one of the main surfaces to ¼ of the thickness which is a distance between the main surfaces.

A die for an EFG apparatus of the present disclosure includes two outer surfaces, at least one slit disposed between the outer surfaces and providing a melt, and two upper surfaces connecting an inner surface of the slit and the outer surfaces. An angle θ formed by the upper surface and a virtual surface perpendicular to the outer surfaces is 60° or more and 85° or less.

A die for an EFG apparatus of the present disclosure includes two outer surfaces, at least one slit disposed between the outer surfaces and providing a melt, and two upper surfaces connecting an inner surface of the slit and the outer surfaces. The upper surface has a first region connecting to the inner surface of the slit, and a second region connecting to the outer surface. An angle θ1 formed by the first region and a virtual surface perpendicular to the outer surface is smaller than an angle θ2 formed by the second region and a virtual surface perpendicular to the outer surface.

An EFG apparatus of the present disclosure includes one of the above-described dies for the EFG apparatus.

A method for manufacturing a single crystal of the present disclosure includes a step for growing a single crystal by using the EFG apparatus.

A method for manufacturing a single crystal member of the present disclosure includes a step for removing at least a part of a surface region having bubbles of the single crystal.

PREFERRED EMBODIMENTS FOR CARRYING OUT THE INVENTION

Figure 1A:
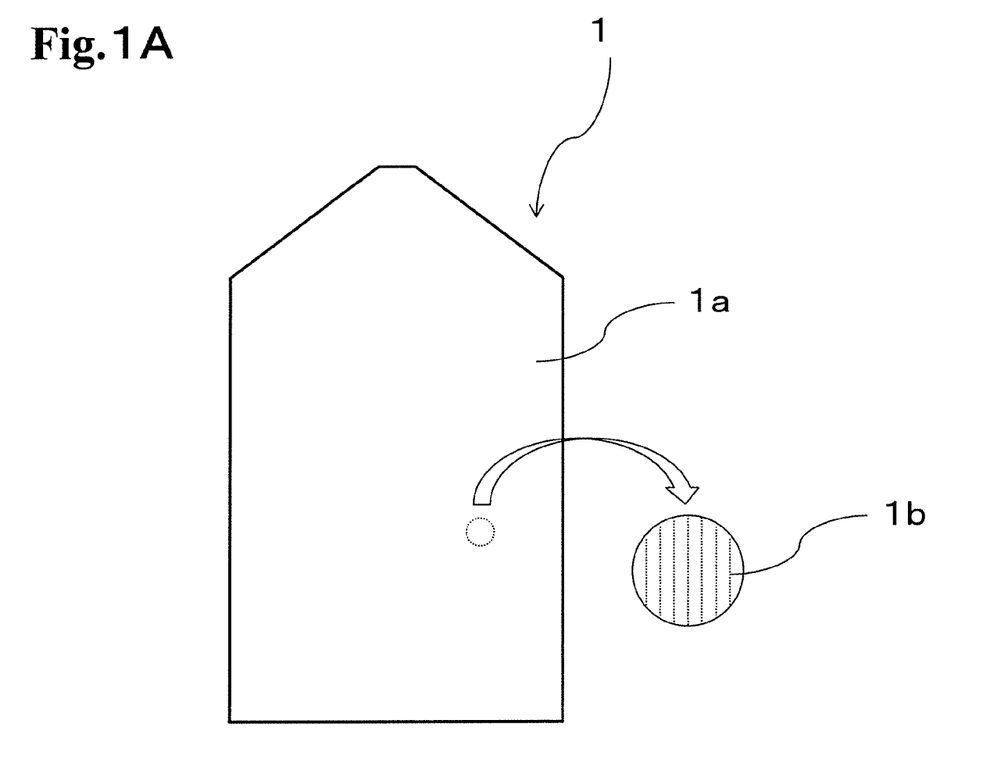
FIG. 1A is a schematic plan view of a single crystal.
Figure 1B:
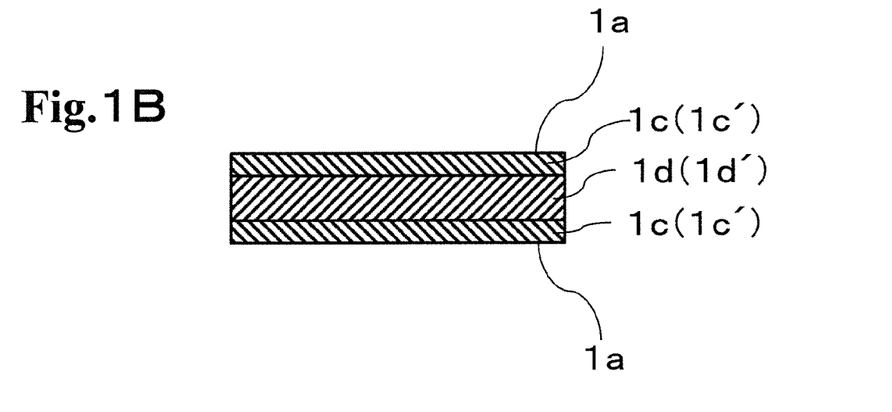
FIG. 1B is a sectional view of FIG. 1A.
Figure 2A:
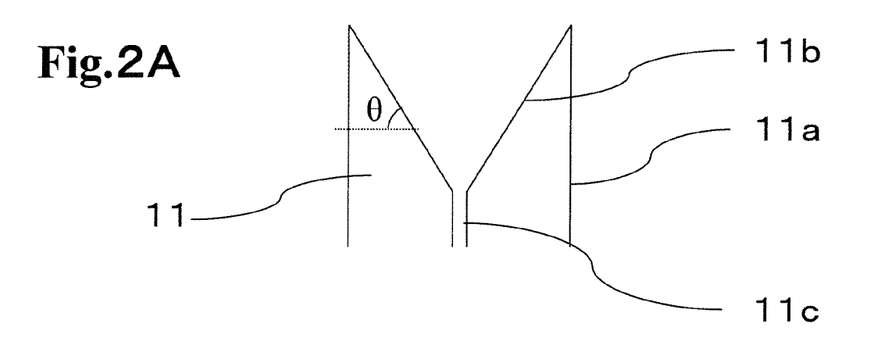
FIG. 2A is a schematic view of an upper surface of a die.
Figure 2B:
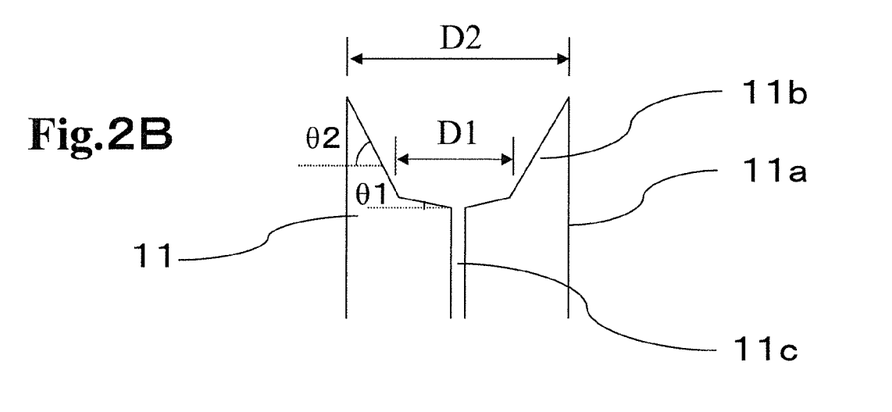
FIG. 2B is a schematic view of an upper surface of a die.
Figure 2C:
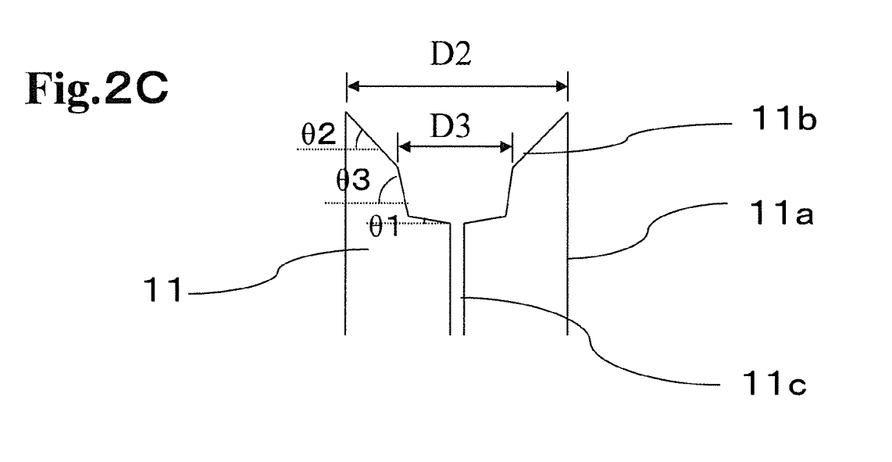
FIG. 2C is a schematic view of an upper surface of a die.
Figure 3:
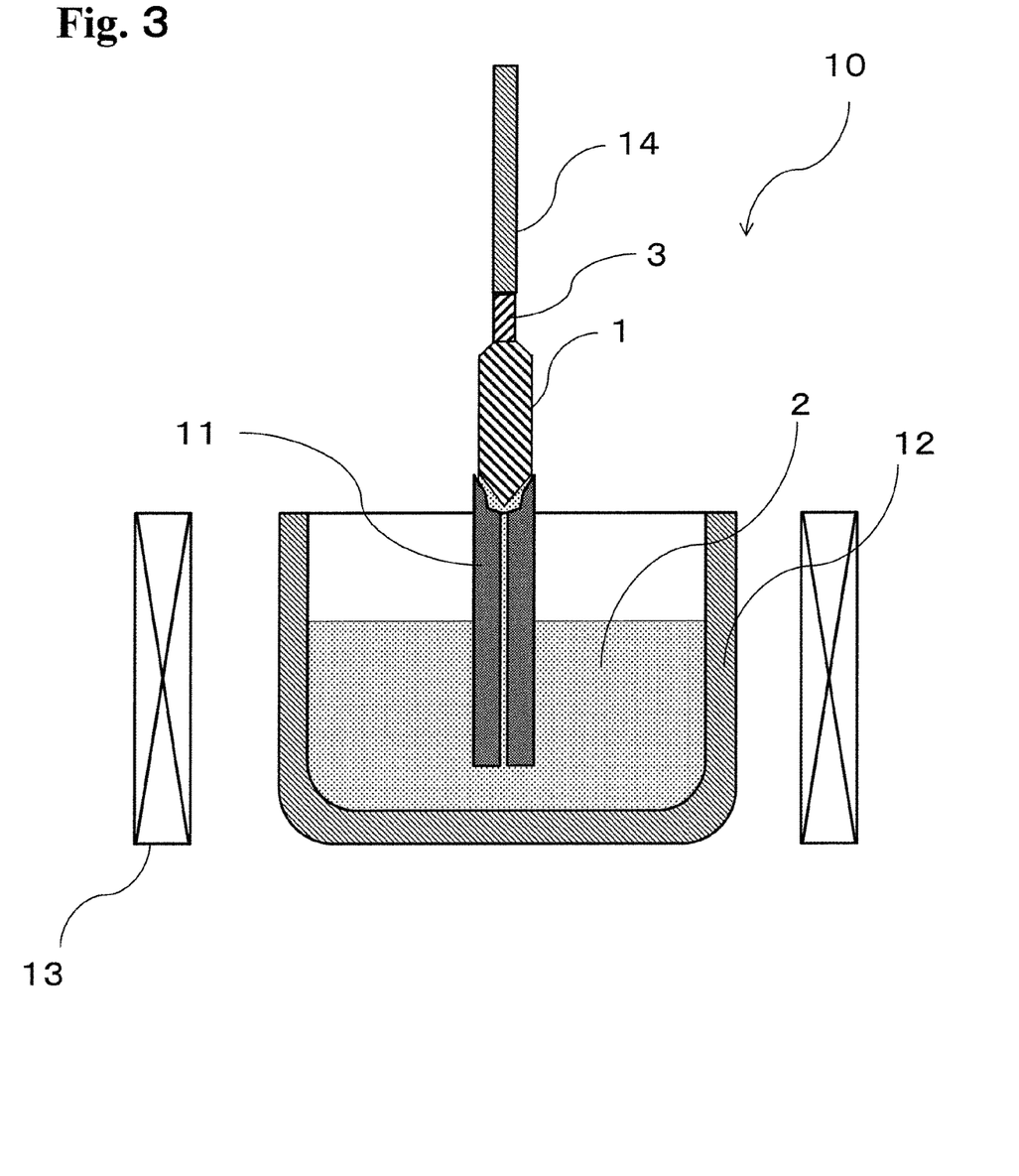
FIG. 3 is a schematic view of an EFG apparatus.
Figure 4:
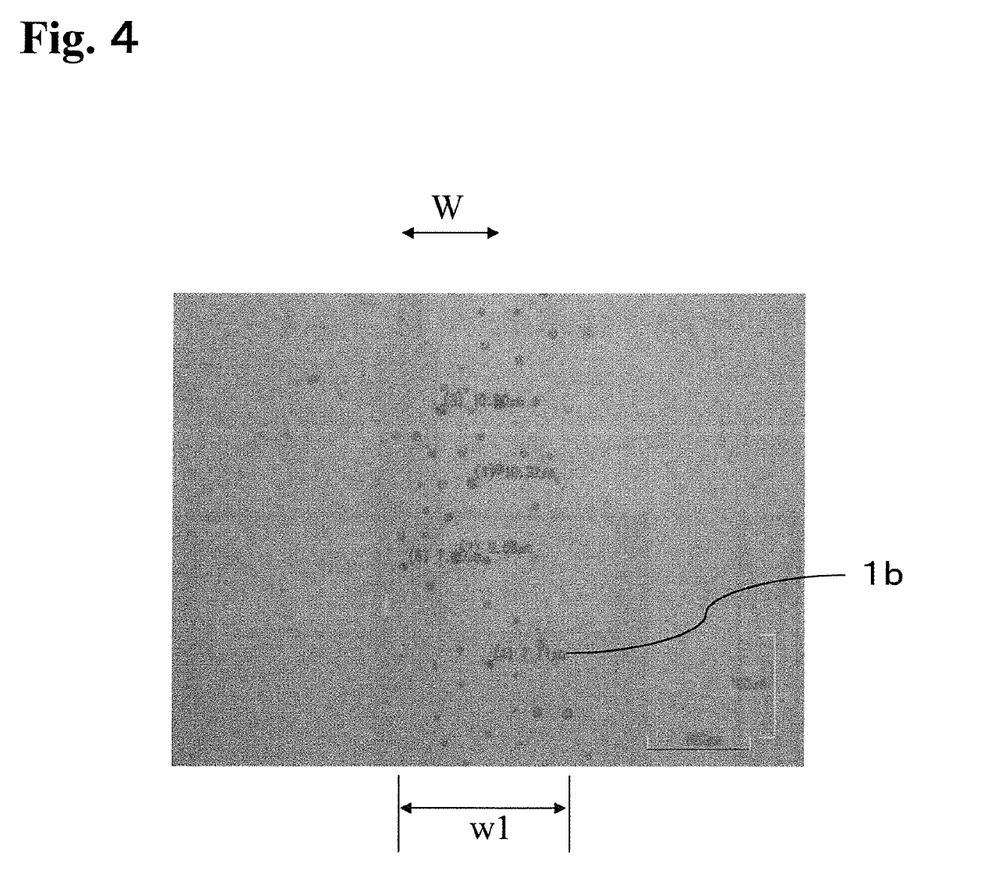
FIG. 4 is an appearance photograph of a single crystal composed of sapphire.

The present disclosure is described below with reference to the figures. FIGS. 1A and 1B are schematic views of a single crystal. FIG. 1A is a plan view, and FIG. 1B is a sectional view of FIG. 1A. FIGS. 2A to 2C are schematic views of an upper part of a die 11, respectively. FIG. 3 is a schematic view of an EFG apparatus 10. FIG. 4 is an appearance photograph of a sapphire single crystal 1.

<Single Crystal, Single Crystal Member, and Method for Manufacturing Single Crystal Member>

FIGS. 1A and 1B are schematic views of the single crystal 1, FIG. 1A is a plan view, and FIG. 1B is a sectional view. Examples of material of the single crystal 1 of the present disclosure include sapphire (single crystal alumina), and silicon. Sapphire is an insulating material excellent in intensity, thermal conductivity, and a translucency, and is used for, for example, a translucent window and a heat exchange member. Silicon is the most common semiconductor material, and it is used for such as an integrated circuit and a solar battery. A thickness of the single crystal 1 is approximately 0.5 mm to 15 mm.

The single crystal 1 of the disclosure is a plate-shaped body having two main surfaces 1a, 1a that are opposite to each other. The single crystal 1 has bubbles 1b arranged in a plurality of line shapes that are parallel to the main surface 1a contained in a region within a depth of 0.5 mm from either one of the main surfaces 1a, 1a. Hereinafter, a region within a depth of 0.5 mm from the main surfaces 1a, 1a that are opposite to each other is defined as a surface region 1c, and a region located more inside than the surface region 1c is defined as an inner region 1d. With the above-mentioned construction, the bubbles 1b capture impurities in the crystal, and thus the high quality single crystal 1 containing less impurities in the inner region 1d can be provided.

That is, in the growth of a sapphire crystal, the bubbles 1b are formed by incorporating oxygen decomposed and generated from alumina of a raw material, and gas component in the raw material into the crystal. The bubbles 1b which are a defect of the crystal have an effect of capturing (gettering) impurities. FIG. 1A schematically shows the bubbles 1b.

The single crystal 1 of the present disclosure is a plate-shaped body having two main surfaces 1a, 1a that are opposed to each other. The single crystal 1 has the bubbles 1b arranged in a plurality of line shapes that are parallel to the main surface 1a within a region from either one of the main surfaces 1a to ¼ of the thickness of the single crystal 1. The thickness of the single crystal 1 is a distance between the two main surfaces 1a, 1a of the single crystal 1. Hereinafter, a region within ¼ of the thickness of the single crystal 1 is defined as a surface region 1c', and a region located more inside than the surface region 1c' is defined as an inner region 1d'. With the above-mentioned construction, the high quality single crystal 1 containing less impurities in the inner region 1d' can be provided. Although FIG. 1B shows the situation that the surface region 1c and the surface region 1c' are almost the same, it is not limited to the embodiment of FIG. 1B.

It is suitable that the bubbles 1b are arranged in a region within a depth of 0.5 mm from each of the two main surfaces 1a, 1a that are opposite to each other of the plate-shaped single crystal 1 (the surface region 1c), and are arranged within a region from the two main surfaces 1a, 1a that are opposite to each other to ¼ of the thickness of the single crystal 1 (the surface region 1c').

It is suitable that the bubbles 1b are arranged within both of the two surface regions 1c (1c') that are opposite to each other.

It is preferable that the bubbles 1b are arranged in both regions within a depth of 0.3 mm from the two main surfaces 1a, 1a, respectively.

If the single crystal 1 is a transparent material, the depth of the bubbles 1b from the main surface 1a can be measured by observing the bubbles 1b from the main surface 1a with an optical microscope, and calculating a difference between the stage height focused on the main surface 1a and the stage height focused on the outer periphery of the bubbles 1b. The depth of the bubbles 1b from the main surface 1a may be also measured by other methods, such as a cross-sectional observation of the crystal 1.

The single crystal 1 has two side surfaces connecting the two main surfaces 1a, 1a, and the width which is a distance between the side surfaces is larger than the thickness. A direction perpendicular to a thickness direction and a width direction is defined as a height direction.

The bubbles 1b have, for example, a diameter of approximately 5 μm to 40 μm, and as shown in FIG. 4, one to several bubbles 1b are arranged in the line in the width direction W of the single crystal 1 and the lines of the bubbles are arranged in the height direction. The width w1 of the one line is, for example, 300 μm or less. The bubbles 1b are arranged in the plurality of lines in the width direction W of the single crystal 1. Pitches between the lines are, for example, approximately 0.3 mm to 2 mm. A density of the bubbles 1b per unit area seen from the main surface 1a is 250 to 2500 pieces/mm$^2$. The density of the bubbles 1b can be calculated by, for example, measuring the number of the bubbles 1b in a region of 0.1 mm in square containing the line-shaped bubbles 1b and dividing it by the area (0.01 mm$^2$) of a measuring region.

The density of the bubbles 1b in the single crystal 1 is higher in the surface region 1c than in the inner region 1d. The difference in density of the bubble 1b is preferably larger. Namely, in the single crystal 1, it is preferable that the bubbles 1b are concentrated in the surface region 1c. Similarly, the density of the bubbles 1b in the single crystal 1 is higher in the surface region 1c' than in the inner region 1d'. The difference in density of the bubble 1b is preferably larger. Namely, in the single crystal 1, it is preferable that the bubbles 1b are concentrated in the surface region 1c'.

One embodiment of a method for manufacturing a single crystal member of the present disclosure includes a step for removing at least a portion of the surface region 1c, 1c' in which the bubbles 1b are arranged in the line. Thereby, a high quality single crystal member with less impurities can be provided. A thickness of the surface region 1c, 1c' to be removed is set to be larger than a sum of a distance from the main surface 1a to the bubbles 1b arranged in the line and ½ of the width of the bubble 1b (a radius if it is a sphere). Since the thickness of the surface region 1c, 1c' to be removed is small in the single crystal 1 of the present disclosure, processing time and processing cost can be reduced.

As a secondary effect, by forming the bubbles 1b in the surface region 1c and/or the surface region 1c', thermal conductivity of the surface region 1c becomes small, and during cooling of the single crystal 1 at the time of the growth, cracks and deformation of the single crystal 1 caused by difference in temperature between the surface region 1c and the inner region 1d of the single crystal 1 can be reduced. When the single crystal member obtained from the single crystal 1 is used under an environment where temperature varies, cracks and deformation during the use of the single crystal member can be reduced if a portion of the surface region 1c and/or the surface region 1c' having a large number of bubbles 1b is left unremoved.

<A Die, an EFG Apparatus, a Method for Manufacturing a Single Crystal> the EFG (edge defined film fed growth) method and the EFG apparatus 10 are a method and an apparatus for growing the single crystal 1 from melt 2.

A die 11 for the EFG apparatus of the present disclosure shown in FIG. 2A (hereinafter referred as a die 11) includes two outer surfaces 11a, at least one slit 11c disposed between the outer surfaces 11a and providing the melt 2, and two upper surfaces 11b connecting the inner surface of the slit 11c and the outer surfaces 11a. Each of the two upper surfaces 11b of the die 11 for the EFG apparatus has an angle θ of 60° or more and 85° or less with a virtual surface perpendicular to the outer surface 11a. The angle θ is measured in the state shown in FIG. 2A. The angle θ is positive when the upper surface 11b of the die 11 becomes higher as separating from the slit 11c.

The die 11 of the present disclosure shown in FIG. 20 includes two outer surfaces 11a, at least one slit 11c disposed between the outer surfaces 11a and providing the melt 2, and two upper surfaces 11b connecting the inner surface of the slit 11c and the outer surfaces 11a. The upper surface 11b has a first region connecting to the inner surface of the slit 11c, and a second region connecting to the outer surface 11a. An angle θ1 formed by the first region and a virtual surface perpendicular to the outer surface 11a is smaller than an angle θ2 formed by the second region and the virtual surface perpendicular to the outer surface 11a. The angle θ1 is positive when the first region becomes higher as separating from the slit 11c. The angle θ2 is positive when the second region becomes higher as separating from the slit 11c.

FIG. 3 is a schematic view of the EFG apparatus 10 including the die 11. The EFG apparatus 10 of the present disclosure includes the die 11, a crucible 12, a heating mean 13, and a lifting shaft 14. In this EFG apparatus 10, the solid raw material stored in the crucible 12 is heated and melted by the heating means 13 to form the melt 2. Next, the single crystal 1 is grown by dipping a seed crystal 3 which is attached to the end of the lifting shaft 14 into the melt 2 provided on the die 11 through the slit 11c and lifting it up.

A method for manufacturing the single crystal of the present disclosure includes a step for growing the single crystal 1 by using the EFG apparatus 10.

By the above-mentioned construction, the bubbles 1b arranged in the line can be formed in the surface region 1c (and/or the surface region 1c') of the single crystal 1 grown by the EFG apparatus 10. Therefore, the bubbles 1b capture metal impurities, and a high quality single crystal 1 containing less impurities can be provided in the inner region 1d.

In the growth of the single crystal 1 from the melt 2, bubbles (not illustrated) are generated in the melt 2. These bubbles include air between granular raw materials which are taken into the melt 2 when the melt 2 is formed from the granular raw materials, the raw materials, the apparatus member, and the gas generated from reaction products between those and oxygen. A part of the bubbles in the melt 2 reaches the upper surface 11b of the die 11 through the slit 11c and is incorporated into the single crystal 1. A part of the bubbles in the melt 2 is continuously provided to substantially the same position of the upper surface 11c of the die 11 to form the bubbles 1b in the line in a direction that the single crystal 1 grows.

According to the die 11 of the present disclosure, the bubbles in the melt 2 provided to the upper surface 11b of the die 11 can easily move to a connecting part to the outer surface 11a along the upper surface 11b of the die 11. Therefore, the bubbles 1b are formed in a region within a depth of 0.5 mm from the two main surfaces 1a, 1a opposite to each other in the plate-shaped single crystal 1, or in a region within ¼ of the thickness of the single crystal 1 from the two main surfaces 1a, 1a opposite to each other.

Shapes in the width and thickness directions of the single crystal 1 grown in the EFG apparatus 10 depend on the shape of the upper surface 11b of the die 11. The shape of the lowermost end part of the single crystal 1 during the growth depends on temperature distribution of the melt 2 between the upper surface 11b of the die 11 and the crystal 1, and it is significantly influenced by the shape of the upper surface 11b of the die 11.

As shown in FIG. 2A, when the angle θ between the upper surface 11b of the die 11 and the virtual surface is 60° or more, bubbles in the melt 2 can easily move to the connecting part with the outer surface 11a along the upper surface 11b. Moreover, when the angle θ is 85° or less, the single crystal 1 having a width larger than the width of the slit 11c can be grown. From the viewpoint of movement of the bubbles, it is further preferable that the angle θ is larger, such as 70° or more. From the viewpoint of growing the single crystal 1 having a large width, it is further preferable that the angle θ is smaller, such as 80° or less. It is suitable that the connecting part between the slit 11c and the upper surface 11b of the die 11 is R chamfered or C chamfered.

At the time of growing the single crystal 1, the shape of the lowermost end of the single crystal 1 is observed to adjust growth conditions, such as an output of the heating mean 13. When the angle θ is fixed in the die 11, the shape of the lowermost end of the single crystal 1 becomes a linear shape during the growth. Therefore, the shape of the single crystal is easily controlled, and the generation of the crystal defects is reduced.

In the die 11 having the first region and the second region as shown in FIG. 2B, the distance between the single crystal 1 during the growth and the upper surface 11b of the die 11 becomes larger in the first region, and it is difficult to incorporate bubbles in the melt 2 into the single crystal 1 in the first region. The angle θ2 of the second region is larger than the angle θ1 of the first region. Thus, it is easy for the bubbles in the melt 2 which have reached the second region to move to the connecting part with the outer surface 11a along the upper surface 11b. Even when the thickness D2 of the second region is small (the angle θ2 of the second region is large), it becomes possible to grow the single crystal 1 having a large width by enlarging the thickness D1 of the first region.

From the viewpoint of movement of bubbles, the angle θ1 is preferably 0° or more, since the bubbles in the melt 2 can move to the second region along the first region of the upper surface 11b. The angle θ2 is preferably 60° or more, since the bubbles in the melt 2 can move to the connecting part with the outer surface 11a along the second region of the upper surface 11b, and it is more preferable that the angle θ2 is 70° or more. The connecting part between the slit 11c and the first region, and the connecting part between the first region and the second region are R chamfered or C chamfered.

From the viewpoint of growing the single crystal 1 having a large width, the angle θ1 is preferably 30° or less, and more preferably 10° or less. The angle θ2 is preferably 85° or less, and more preferably 80° or less.

During the growth of the single crystal 1, the shape of the lowermost end of the single crystal 1 is observed to adjust growth conditions, such as an output of the heating mean 13. When the angle θ1 is fixed in the first region, it is easy to observe the shape of the lowermost end of the single crystal 1 during the growth. When the angle θ2 is fixed in the second region, the shape of the lowermost end of the single crystal 1 becomes a linear shape during the growth. Therefore, the shape of the single crystal 1 is easily controlled, and the generation of the crystal defects is reduced.

From the viewpoint of movement of bubbles and growth of the single crystal 1 having a large width, it is preferable that the thickness D2 of the second region is larger than the thickness D1 of the first region.

Like the die 11 shown in FIG. 2C, it is preferable that the upper surface 11b of the die 11 has a third region formed between the first region and the second region, and an angle θ3 formed with a horizontal surface perpendicular to the outer surface 11a is larger than the angle θ2, since the bubbles in the melt 2 can move smoothly from the first region to the second region and the lowermost end of the single crystal 1 during the growth can be easily observed. The angle θ3 is positive when the third region becomes higher as separating from the slit 11c.

The angle θ3 is preferably 70° or more and 90° or less. The angle θ3 is preferably fixed. It is preferable that the connecting part between the first region and the third region and the connecting part between the third region and the second region are R chamfered or C chamfered. It is preferable that thickness D3 of the third region is smaller than the thickness D2 of the second region. A height H3 of the third region is preferably ¼ or more and ¾ or less with respect to a height H of the entire upper part 11b of the die 11.

Furthermore, the upper part 11b of the die 11 may have a fourth region having an angle θ4 formed with the horizontal surface, and a fifth region having an angle θ5 formed with the horizontal surface.

Example

A plate-shaped body sapphire single crystal having a width of 110 mm and a thickness of 2 mm was grown by using the EFG apparatus 10 equipped with a molybdenum die 11 of θ=70° as Example 1, and a molybdenum die 11 of θ1=10°, θ2=80° and θ3=70° as Example 2. As Comparative Example, a plate-shaped body sapphire single crystal having a width of 110 mm and a thickness of 2 mm was grown by using an EFG apparatus equipped with a molybdenum die of θ=45° (not illustrated).

The depths of the bubbles 1b formed in the line near the main surface 1a were 0.5 mm in Example 1, 0.3 mm in Example 2, and 0.7 mm in Comparative Example.

In Example 1, molybdenum concentration in the single crystal 1 was measured by the laser ICP-MS method in the region containing the line-shaped bubbles 1b, the region in which the line-shaped bubbles 1b are not contained, and the inner region 1d which is approximately 1 mm away from the main surface 1a among the surface region 1c. As a result, the molybdenum concentration in the region containing the bubbles 1b was about 50 times of that in the inner region 1d, and the molybdenum concentration in the region in which the bubbles 1b are not contained was about 10 times of that in the inner region 1d. From this result, it is considered that the molybdenum in the single crystal 1 is captured to the area around the bubbles 1b, so that the molybdenum concentration in the surface region 1c containing a plenty of bubbles 1b becomes high, and the molybdenum concentration in the inner region 1d becomes low.

Since the single crystal of the present disclosure contains less impurities in the inner region other than the surface region, a high quality single crystal can be provided.

According to the die for the EFG apparatus, the EFG apparatus, and the method for manufacturing the single crystal of the present disclosure, a high quality single crystal having less impurities in the inner region other than the surface region can be provided.

According to the method for manufacturing the single crystal member of the present disclosure, processing time and processing cost for obtaining a high quality single crystal member can be reduced.

While the embodiments of the present disclosure have been explained, the present disclosure is not limited to the foregoing embodiments but various changes and modifications can be made within the scope described in claims.

EXPLANATION OF SYMBOLS

1: single crystal
1a: main surface
1b: bubble
1c: surface region
1d: inner region
2: melt
3: seed crystal
10: EFG apparatus
11: die
11a: outer surface
11b: upper surface
11c: slit
12: crucible
13: heating mean
14: lifting shaft

The invention claimed is:

1. A single crystal comprising a plate-shaped body having two main surfaces opposite to each other, wherein
the plate-shaped body comprises bubbles arranged in a plurality of line shapes parallel to the two main surfaces in a region within a depth of 0.3 mm from the two main surfaces.

2. The single crystal according to claim 1, wherein the bubbles are arranged within a region from the main surfaces to ¼ of the thickness which is a distance between the main surfaces.

3. The single crystal according to claim 1, wherein the crystal is sapphire.

4. A die for an EFG apparatus comprising:
two outer surfaces,
at least one slit disposed between the outer surfaces and providing a melt, and
two upper surfaces connecting an inner surface of the slit and the outer surfaces, wherein
the upper surface comprises a first region connecting to the inner surface of the slit, and
a second region connecting to the outer surface, wherein
an angle θ1 formed by the first region and a virtual surface perpendicular to the outer surface is smaller than an angle θ2 formed by the second region and a virtual surface perpendicular to the outer surface, and the angle θ1 is fixed in the first region.

5. The die for the EFG apparatus according to claim 4, wherein the angle θ1 is 0° or more and 30° or less.

6. The die for the EFG apparatus according to claim 4, wherein the angle θ2 is 60° or more and 85° or less.

7. The die for the EFG apparatus according to claim 4 for growing sapphire.

8. An EFG apparatus comprising:
the die for the EFG apparatus according to claim 4.

9. A die for an EFG apparatus comprising:
two outer surfaces,
at least one slit disposed between the outer surfaces and providing a melt, and
two upper surfaces connecting an inner surface of the slit and the outer surfaces, wherein
the upper surface comprises a first region connecting to the inner surface of the slit, and a
second region connecting to the outer surface, wherein
an angle θ1 formed by the first region and a virtual surface perpendicular to the outer surface is smaller than an angle θ2 formed by the second region and a virtual surface perpendicular to the outer surface, and wherein
the angle θ2 is fixed in the second region.

10. The die for the EFG apparatus according to claim 9 for growing sapphire.

11. An EFG apparatus comprising:
the die for the EFG apparatus according to claim 9.

12. A die for an EFG apparatus comprising:
two outer surfaces,
at least one slit disposed between the outer surfaces and providing a melt, and
two upper surfaces connecting an inner surface of the slit and the outer surfaces, wherein
the upper surface comprises a first region connecting to the inner surface of the slit, and a
second region connecting to the outer surface, wherein
an angle θ1 formed by the first region and a virtual surface perpendicular to the outer surface is smaller than an angle θ2 formed by the second region and a virtual surface perpendicular to the outer surface, and further comprising
a third region, which has an angle θ3 formed with the virtual surface, between the first region and the second region, wherein the angle θ3 is larger than the angle θ2.

13. The die for the EFG apparatus according to claim 12, wherein the angle θ3 is 70° or more and 90° or less.

14. The die for the EFG apparatus according to claim 12, wherein the angle θ3 is fixed in the third region.

15. The die for the EFG apparatus according to claim 12, wherein a thickness of the third region is smaller than a thickness of the second region.

16. The die for the EFG apparatus according to claim 12 for growing sapphire.

17. An EFG apparatus comprising:
the die for the EFG apparatus according to claim 12.

18. A method of manufacturing a single crystal member comprising:
a step for removing at least a part of a surface region having bubbles of the single crystal according to claim 1.

19. A method of manufacturing a single crystal comprising:
a step for growing a single crystal by using the die for an EFG apparatus according to claim 4.

* * * * *